United States Patent [19]
Vig et al.

[11] Patent Number: 5,925,502

[45] Date of Patent: Jul. 20, 1999

[54] METHOD OF METALLIZING A QUARTZ RESONATOR

[75] Inventors: John R. Vig, Colts Neck; Mary Hendrickson, Forked River; Sally M. Laffey, S. Bound Brook, all of N.J.

[73] Assignee: The United States of America as represented by the Secretary of the Army, Washington, D.C.

[21] Appl. No.: 08/835,062

[22] Filed: Apr. 3, 1997

Related U.S. Application Data

[62] Division of application No. 08/504,037, Jul. 19, 1995., abandoned, which is a continuation of application No. 08/249,497, May 20, 1994, abandoned.

[51] Int. Cl.$^6$ ........................................................ G03F 7/00
[52] U.S. Cl. ............................................ 430/315; 430/329
[58] Field of Search ................................ 430/5, 311, 313, 430/315, 324, 329; 428/209

[56] References Cited

U.S. PATENT DOCUMENTS 4,080,267  3/1978  Castellani .................................. 204/15

*Primary Examiner*—Kathleen Duda
*Attorney, Agent, or Firm*—Michael Zelenka; John M. O'Meara

[57] ABSTRACT

An improved quartz resonator is obtaind using a mask which is kept in intimate contact with the quartz substrate during the electrode metallization.

4 Claims, No Drawings

METHOD OF METALLIZING A QUARTZ RESONATOR

This application is a divisional of pending application Ser. No. 08/504,037 which was filed on Jul. 19, 1995 and abandoned with the filing of this application, which was a continuation of pending application Ser. No. 08/249,497 that was filed on May 20, 1994 and abandoned with the filing of application Ser. No. 08/504,037.

GOVERNMENT INTEREST

The invention described herein may be manufactured, used, and licensed by or for the Government for governmental purposes without the payment to us of any royalties thereon.

FIELD OF INVENTION

The invention relates in general to a method of metallizing a quartz substrate and to the metallized substrate so obtained and in particular, to a method of depositing a gold electrode onto a quartz resonator substrate in such a manner that the gold rim that usually surrounds the electrode is eliminated.

BACKGROUND OF THE INVENTION

In many applications of quartz crystal oscillators, the oscillator noise is an important parameter. For example, excessive oscillator noise will limit the performance of radar, navigation and communications systems. In a properly designed high precision oscillator, the quartz crystal resonator is often the major noise determining component. Reducing the noise of the resonator has been an important goal of resonator and oscillator designers.

The gold electrodes that are used on most high precision resonators can be a significant noise source, especially when the electrodes are deposited through masks which are not in intimate contact with the surfaces of the quartz plate. Specifically, when gold has been deposited onto a quartz resonator substrate through a shadow mask, thinning of the gold has been observed around the edges of the pattern. Because the mask has not been in intimate contact with the quartz, that is, has not been in touch with the major surfaces of the quartz plate, gold metal forms shadows around mask edges.

For example, when a 100 nanometer thick circular gold electrode is deposited onto a quartz plate through a 5 millimeter diameter opening in a mask that is not in direct contact with the surfaces of the quartz plate, it has been found that the electrode thickness does not change abruptly from 100 nm inside the 5 mm diameter circle to zero outside the 5 mm circle. The transition is gradual; that is, a narrow rim is formed outside the 5 mm circle. Across the width of this rim, the thickness decreases gradually from 100 nm to zero. The ultrathin gold film in such a rim can be very noisy. Furthermore, when this thinning gold is less than 40 nm thick, it adheres rigidly to the quartz substrate, whereas the rest of the gold electrode, that is thicker, adheres very weakly. The rim, therefore, can be a source of noise and other instabilities in a quartz resonator. A similar rim is formed when the electrode is of a material other than gold. Ultrathin films, in general, tend to be noisy and are, therefore, detrimental to the performance of high stability resonators.

SUMMARY OF THE INVENTION

The general object of this invention is to provide an improved quartz resonator. A more particular object of the invention is to provide such a resonator in which the problems of noise generation and instabilities have been reduced or eliminated. A particular object of the invention is to provide a method of depositing a gold pattern onto a quartz substrate through a mask in such a manner that gold metal does not shadow under the mask edges, the thinning gold does not adhere rigidly to the quartz, and the formation of noisy, ultrathin gold film is minimized.

It has now been found that the foregoing objects can be attained by depositing gold electrodes onto a quartz substrate using a mask that minimizes the formation of a strongly adhering gold rim surrounding the electrodes, by maintaining intimate contact between the quartz substrate and the masking material during electrode deposition.

More particularly, according to one embodiment of the invention, a quartz substrate is first cleaned to remove organic contamination. The quartz substrate is then coated with photo-resist, exposed and developed using a mask patterned with the desired electrode pattern. The quartz substrate patterned with the desired electrode pattern is then metallized. Intimate contact is maintained between the quartz substrate and the masking material during evaporation. The unwanted metal deposited on top of the photoresist and the photoresist is removed from the quartz substrate using a process called "lift-off". The lift-off process is completed by immersing the substrate in acetone that removes the photoresist and the unwanted metal from the quartz substrate leaving metal in the patterned electrode area. The gold electrode pattern remains intact throughout the lift-off process. SEM results show no thinning of gold around edges of electrode pattern. Adhesion tests on this sample show that the entire electrode is easily removed with no trace of a gold rim. This demonstrates that intimate contact between the quartz substrate and the masking material during electrode deposition is capable of eliminating the thin gold rim surrounding the electrode.

DESCRIPTION OF THE PREFERRED EMBODIMENT

The aforedescribed method can be carried out using a sulfuric acid/hydrogen peroxide solution to remove organic contamination prior to photoresist coating. Alternate cleaning methods, such as ultraviolet-ozone cleaning, may also be used. A positive tone photo-resist is used as the photoresist, and a conventional electron beam evaporator such as one CVC 6000 is also used. The quartz substrate is about 400 microns in thickness and the total thickness of gold is about 100 nanometers. The wafer is rinsed in isopropyl alcohol and dried.

Other modifications of the invention are possible. For example, one might deposit gold electrodes through a thin metal foil mask that makes intimate contact with the quartz plate as for example, by sliding in the mask in the usual way, then have a second motion of the mask perpendicular to the first to bring the mask into contact with the quartz plate. For depositing onto contoured resonators, the mask can be made, for example, from very thin flexible silicon or similar material to conform to the quartz substrate. Since it is only less than 40 nm thickness films that adhere strongly, another method of achieving a weakly adhering gold film, without the strongly adhering rim, is to deposit the electrode with the conventional deposition method, through a mask; then etch away the rim. The etching method can be wet or dry. Dry etching with reactive ion etching or with an ion beam are preferred.

Although quartz is currently the material of choice for high stability resonators, the method is also applicable to resonators made of lithium tetraborate, or langasite, and the electrodes on the resonators can be gold, or aluminum, or silver, or any conducting film.

We wish it to be understood that we do not desire to be limited to the exact details of construction shown and described for obvious modifications will occur to a person skilled in the art.

What is claimed is:

1. Method of depositing metal in a desired pattern on a quartz substrate so as to derive the pattern with no metal rim extending therefrom, comprising:

cleaning the substrate to remove organic contamination;

coating the substrate with a photoresist;

exposing the photoresist to develop the pattern on the substrate;

metallizing the pattern on the substrate;

immersing the substrate in acetone to lift-off any metal rim deposit that extends around and beyond the pattern on the substrate; and drying the substrate.

2. The method of claim 1 wherein the step of exposing the photoresist is accomplished with a mask.

3. The method of claim 1 wherein the step of metallizing the pattern is accomplished with an electron beam evaporator.

4. The method of claim 1 wherein the pattern includes electrodes and is metallized with gold.

* * * * *